United States Patent [19]
Lyu

[11] Patent Number: 6,025,605
[45] Date of Patent: *Feb. 15, 2000

[54] ALIGNED SEMICONDUCTOR STRUCTURE

[75] Inventor: Ki-Hyun Lyu, Kyungki-do, Rep. of Korea

[73] Assignee: LG Electronics Inc., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/799,389

[22] Filed: Feb. 11, 1997

[30] Foreign Application Priority Data

Jul. 26, 1996 [KR] Rep. of Korea .................. 96-10637

[51] Int. Cl.[7] .......................... H01L 29/04; H01L 31/036; H01L 31/0376; H01L 31/20
[52] U.S. Cl. ................. 257/59; 257/61; 257/72; 257/353; 257/354
[58] Field of Search ................ 257/57, 59, 61, 257/66, 72, 347, 352, 353, 354

[56] References Cited

U.S. PATENT DOCUMENTS

| | | |
|---|---|---|
| 4,951,113 | 8/1990 | Huang et al. . |
| 5,084,905 | 1/1992 | Sasaki . |
| 5,202,572 | 4/1993 | Kobayashi ............................. 257/60 |
| 5,274,250 | 12/1993 | Miyake et al. ....................... 257/59 |
| 5,327,001 | 7/1994 | Wakar et al. ........................ 257/350 |
| 5,367,180 | 11/1994 | Asai et al. ............................ 257/66 |
| 5,371,398 | 12/1994 | Nishihara ............................ 257/435 |
| 5,614,731 | 3/1997 | Uchikoga et al. .................... 257/59 |
| 5,616,932 | 4/1997 | Sano et al. ........................... 257/52 |
| 5,641,974 | 6/1997 | den Boer et al. .................... 257/59 |
| 5,751,020 | 5/1998 | Lyu ........................................ 257/72 |

*Primary Examiner*—Ngân V. Ngô
*Attorney, Agent, or Firm*—Finnegan, Henderson, Farabow, Garrett & Dunner, L.L.P.

[57] ABSTRACT

The number of mask steps used to fabricate a TFT in an AMLCD is reduced. In particular, source and drain metallizations, as well as doped and undoped semiconductor layers are patterned at the same time, and the source and drain metallizations and the doped semiconductor layer are etched in a single etching step using an insulating passivation layer as a mask to form source and drain electrodes. Manufacturing costs can be reduced and the manufacturing yield can be improved.

7 Claims, 7 Drawing Sheets

ALIGNED SEMICONDUCTOR STRUCTURE

BACKGROUND OF THE INVENTION

1. Field of the Invention

The present invention relates to a method for manufacturing active matrix liquid crystal displays ("AMLCD"), and to the structure of AMLCDs manufactured by such a method.

2. Discussion of the Related Art

AMLCDs comprise active elements such as thin film transistors ("TFT") as switching devices for driving and controlling each pixel of the display.

Figure 1A:
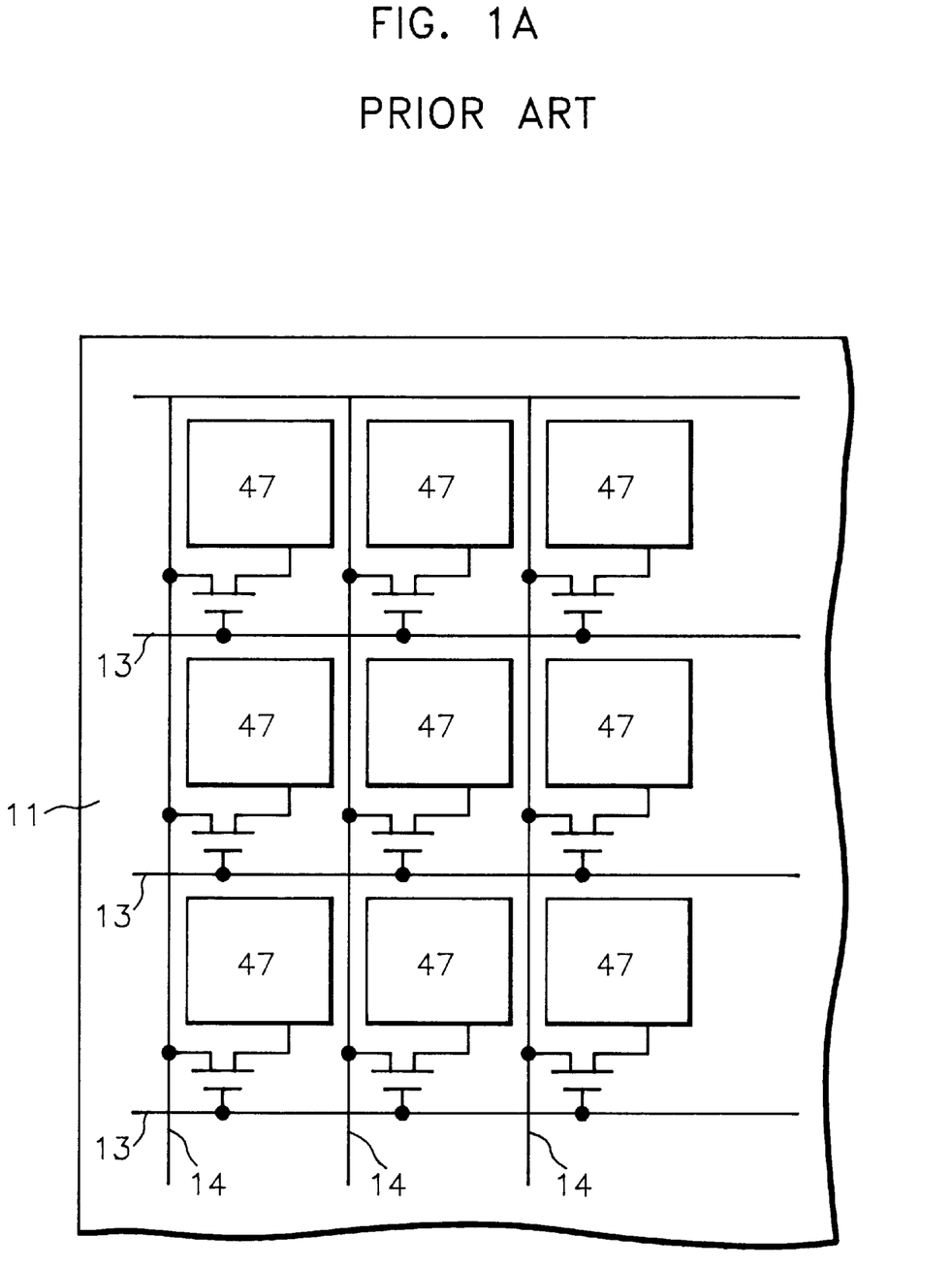
FIG. 1A is an overall plan view of a conventional LCD.

As shown in FIG. 1A, in a conventional AMLCD including an array of TFTs, substantially rectangular pixel electrodes 47 are closely arranged in rows and columns on a transparent glass substrate. Gate bus lines (address lines) 13 are respectively formed closely along the rows of the pixel electrodes 47 and source bus lines (data lines) 14 are respectively formed closely along the columns of the pixel electrodes.

Figure 1B:
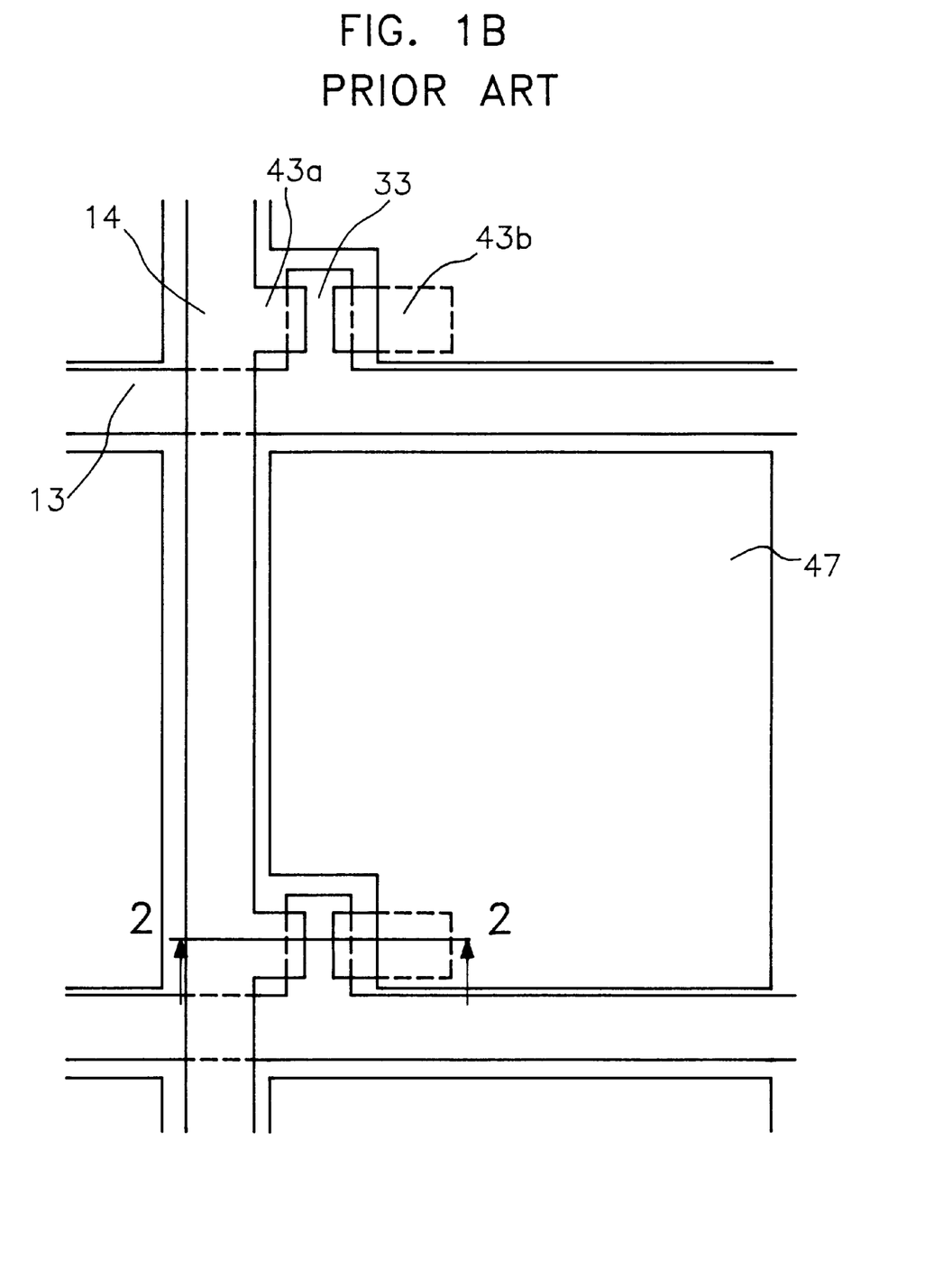
FIG. 1B is an enlarged plan view of one liquid crystal display element of the conventional LCD of FIG. 1.
Figure 2A:
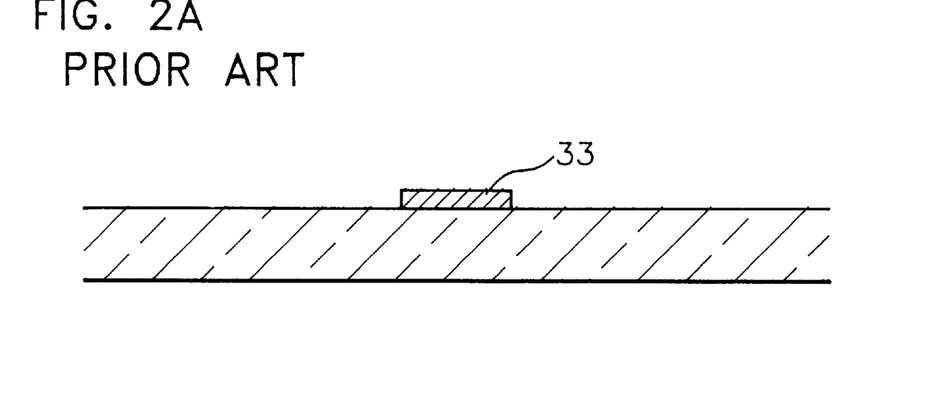
FIGS. 2A to 2E are cross-sectional views showing a conventional AMLCD at various states of a conventional manufacturing process.

Referring to FIG. 1B, a plan view showing an enlargement of a single pixel of the AMLCD shown in FIG. 1A, gate bus lines 13 having gate electrode extensions 33 are formed on a transparent glass substrate 31 (FIG. 2A). An insulating layer 35 (FIG. 2B) covers the gate bus lines 13 and the gate electrodes 33, and a plurality of parallel source bus lines 14 are provided on the insulating layer extending perpendicular to gate bus lines 13. Near each gate bus line 13 and source bus line 14 intersection, a semiconductor layer 37 (FIG. 2B) is formed on the insulating layer covering the gate bus lines and the gate electrodes. Spaced source and drain electrodes, 43a and 43b respectively FIG. 2D), are formed opposite one another on the semiconductor layer. In this manner, TFTs as active elements are formed.

A manufacturing process of a conventional AMLCD is described below with reference to FIGS. 2A to 2E, showing cross-sectional views taken along a line 2—2 of FIG. 1B.

A gate electrode 33 (extension of a gate bus line 13) is formed on a transparent glass substrate 31 by depositing and patterning a first metal layer (FIG. 2A). A first insulating layer (a gate insulating layer) 35 made of $SiN_x$, a semiconductor layer 37 made of a-Si, and a second insulating layer made of $SiN_x$ are then successively deposited on the entire surface of the substrate.

Figure 2B:
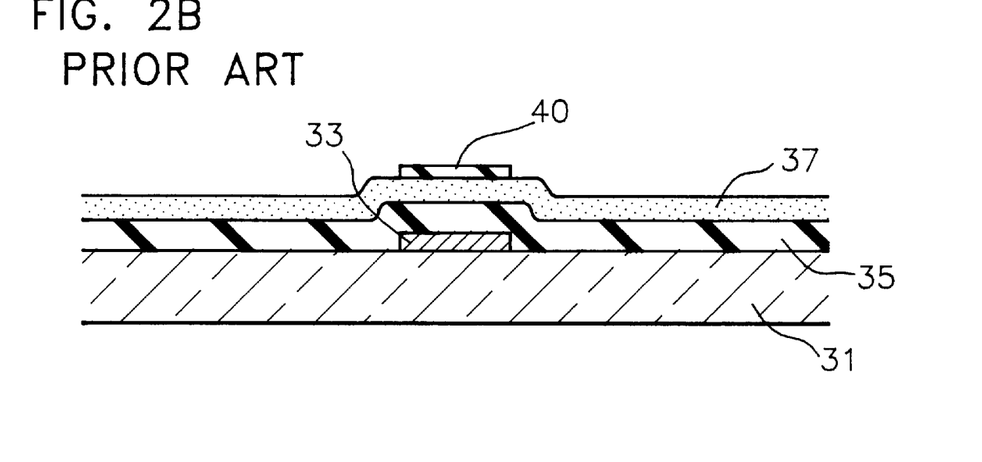
Figure 2C:
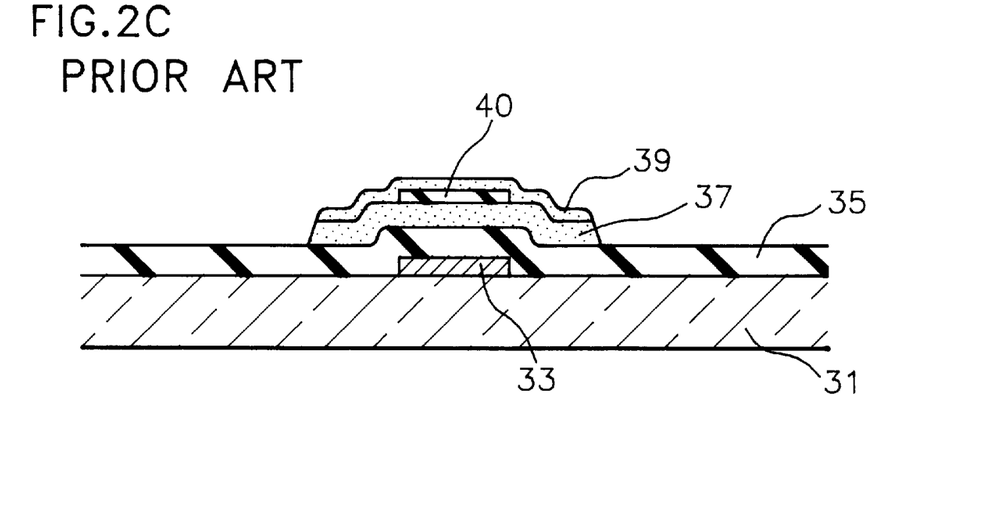

As shown in FIG. 2B, an etch-stopper 40 is formed by patterning the second insulating layer, and an impurity doped semiconductor layer 39 including $n^+$ a-Si is then deposited over the entire substrate and patterned together with the semiconductor layer 37 (FIG. 2C).

Figure 2D:
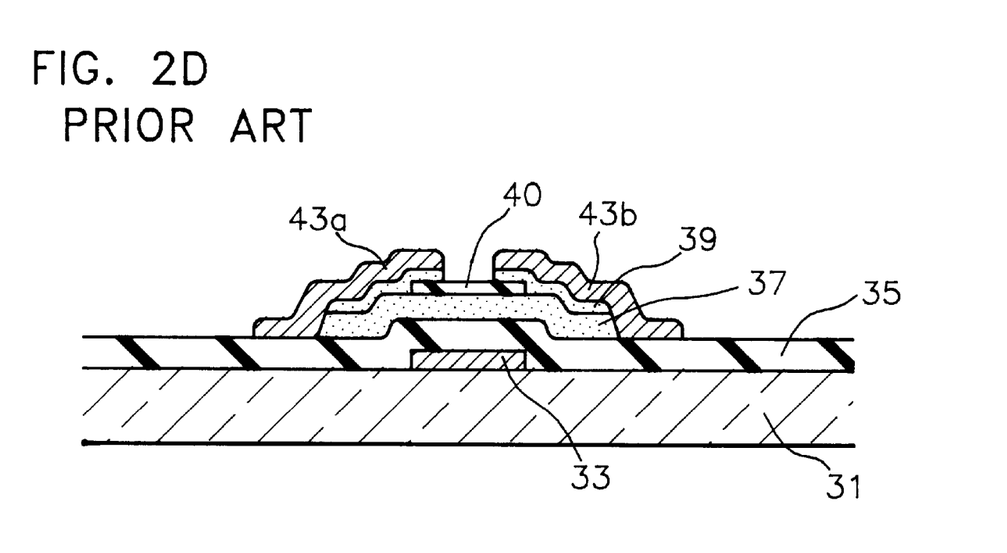

A second metal layer 43 is next deposited on the entire surface of the substrate, which is then patterned to form a bus line, a source electrode 43a branching out from the source bus line, and a drain electrode 43b. Next, an exposed portion of the impurity doped semiconductor layer 39 is etched using the source and drain electrodes as masks, as shown in FIG. 2D.

Figure 2E:
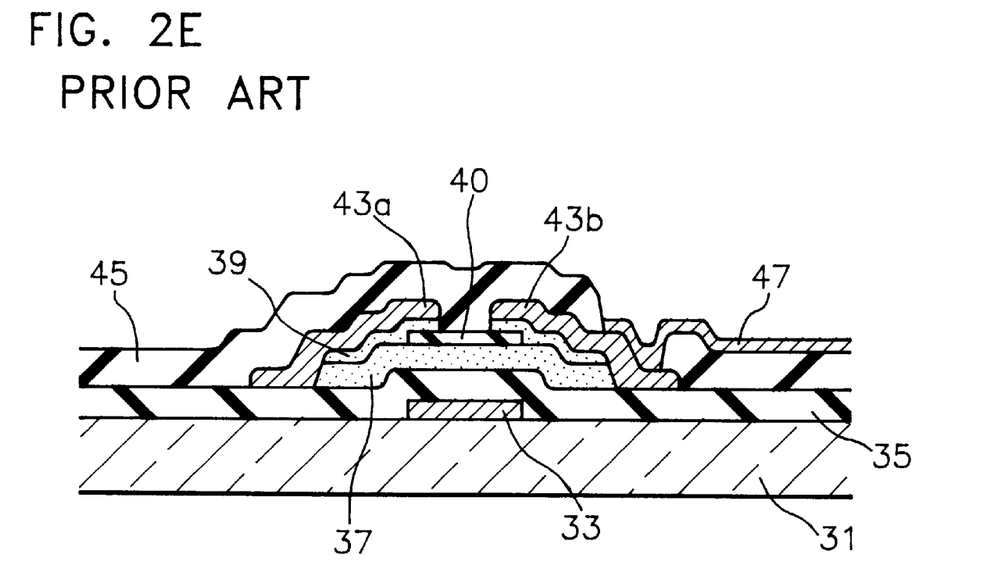

An insulating passivation layer 45 is then formed by depositing another Si-nitride layer over the first insulating layer and the source and drain electrodes. Then a contact hole is formed by etching the insulating passivation layer 45. An ITO layer is sputter deposited on the insulating passivation layer 45. The ITO layer is patterned to form a pixel electrode 47, which is electrically connected to the drain electrode 43b through a contact hole (FIG. 2E).

This conventional process of manufacturing the TFTs is very complicated. Moreover, it takes a great deal of time to pattern the various layers of the AMLCD because the mask must be aligned precisely, and photo-resists must be coated and developed for each mask step. Further, the manufacturing yield is low.

SUMMARY OF THE INVENTION

The objective of the present invention is to provide a method for manufacturing AMLCDs, in which the number of mask steps is reduced by patterning a second metal layer and a semiconductor layer at the same time. Moreover, source and drain electrodes are formed by etching a portion of the second metal layer together with a portion of an impurity doped semiconductor layer using an insulating passivation layer as a mask.

In particular, the method according to the present invention comprises the following steps. A first metal layer is deposited on a transparent substrate, and gate bus lines and gate electrodes are formed by patterning the first metal layer. A first insulating layer, a semiconductor layer and a second insulating layer are sequentially deposited on the substrate on which the gate bus line and the gate electrode are formed. An etch-stopper is formed by patterning the second insulating layer, and an impurity-doped semiconductor layer is deposited on the etch-stopper and the semiconductor layer. A second metal layer is deposited on the impurity-doped semiconductor layer, and the second metal layer, the impurity-doped semiconductor layer and the semiconductor layer are patterned. An insulating passivation layer is deposited on the patterned second metal layer and the first insulating layer. A contact hole is then formed and a part of the second metal layer on the etch-stopper is exposed by patterning the insulating passivation layer. A transparent conductive layer is deposited on the insulating passivation layer and onto the exposed part of the second metal layer. A pixel electrode is formed by patterning the transparent conductive layer such that the pixel electrode is electrically connected with the second metal layer through a contact hole. Source and drain electrodes are formed by etching a part of the second metal layer and a part of the impurity-doped semiconductor layer, with the insulating passivation layer being used as a mask.

An AMLCD, according to the present invention, comprises a transparent glass substrate, gate bus lines and gate electrodes formed on the transparent glass substrate, a gate insulating layer formed on the transparent glass substrate on which the gate bus lines and the gate electrodes are formed, a semiconductor layer formed on the gate insulating layer, an etch-stopper formed on a portion of the semiconductor layer, an impurity-doped semiconductor layer formed on the semiconductor layer and separated into two parts on the etch-stopper, source and drain electrodes formed on each part of the separated impurity-doped semiconductor layer, respectively, an insulating passivation layer formed on the source and drain electrodes and having a contact hole, and a pixel electrode formed on a portion of the insulating passivation layer, the pixel electrode being electrically connected with the drain electrode through the contact hole.

DETAILED DESCRIPTION OF THE PREFERRED EMBODIMENT

The method for manufacturing AMLCDs according to the present invention will now be described below with reference to the drawings.

Figure 3A:
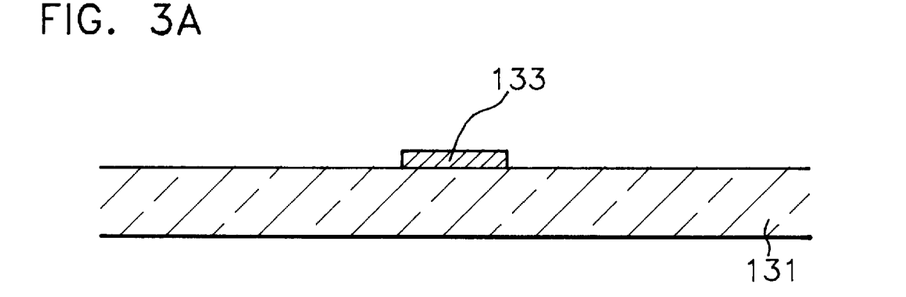
FIGS. 3A to 3I illustrate cross-sectional views of an AMLCD according to the present invention at various stages of a manufacturing process therefor, in accordance with the present invention.

A first metal layer of Al or Al alloy, such as Al—Pd, Al—Si, Al—Si—Ti, Al—Si—Cu, is preferably sputter deposited on a transparent glass substrate 131. A gate electrode 133 is then formed by selectively etching the first metal layer using a photo-lithography technique (FIG. 3A).

If necessary, an anodized layer may be formed on the gate electrode 133 by anodizing the gate electrode 133 in order to improve its chemical-resistance, heat-resistance and adhesiveness to a subsequently formed gate insulating layer. The anodized layer also functions as an insulating layer together with a Si-nitride gate insulating layer and therefore improves electrical isolation between the gate electrode 133 and an adjacent signal line.

Figure 3B:
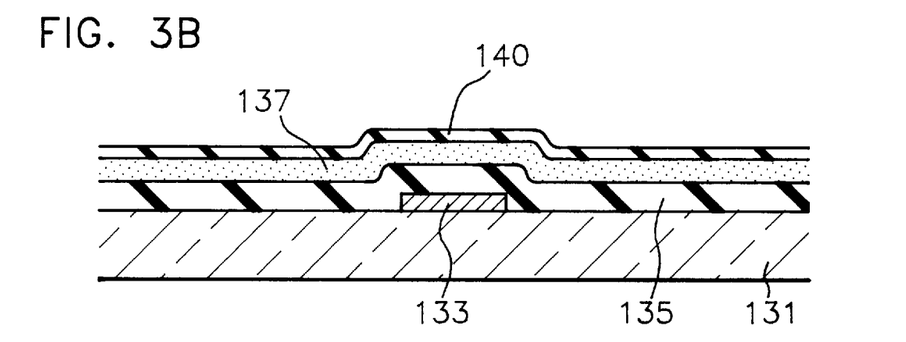

As shown in FIG. 3B, a first insulating layer (a gate insulating layer) 135, an undoped a-Si semiconductor layer 137, and a second insulating layer 140 of Si-nitride are successively deposited on transparent glass substrate 131.

Figure 3C:
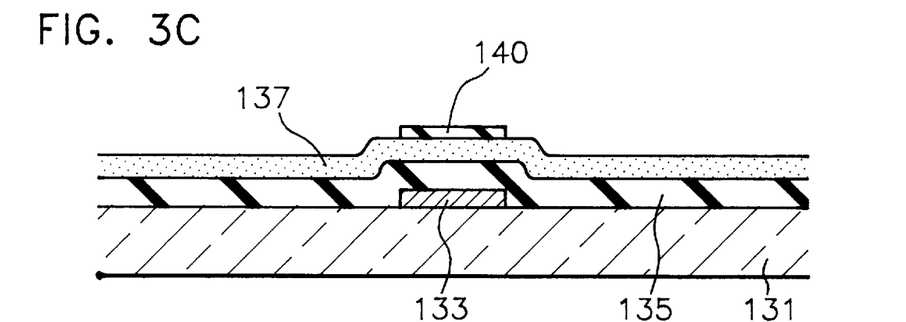
Figure 3D:
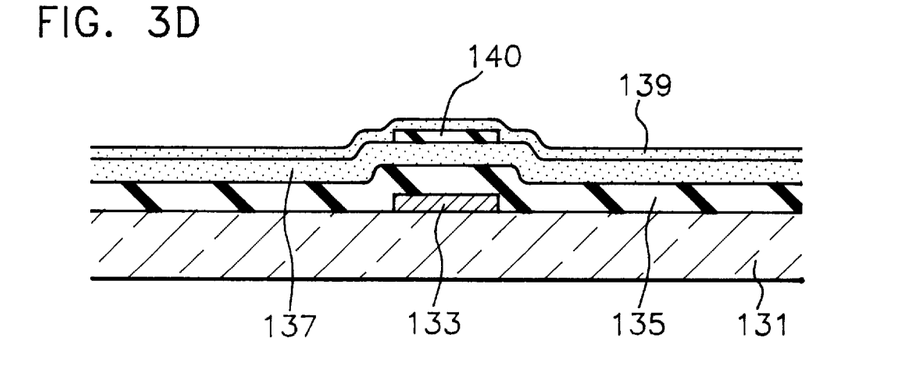

As seen in FIG. 3C, an etch-stopper 140 is then formed by patterning the second insulating layer, followed by deposition of a doped n$^+$ semiconductor layer 139 on the etch-stopper 140 and the semiconductor layer 137 by plasma CVD in an atmosphere of hydrogen and phosphine gases (FIG. 3D).

Figure 3E:
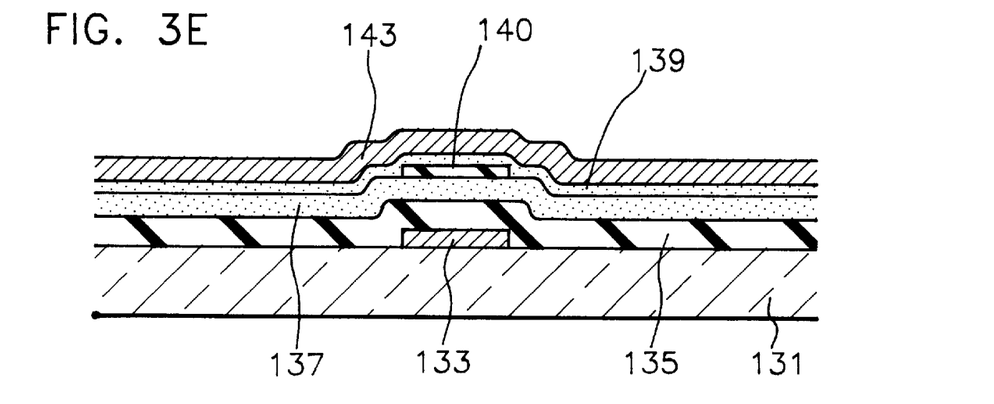
Figure 3F:
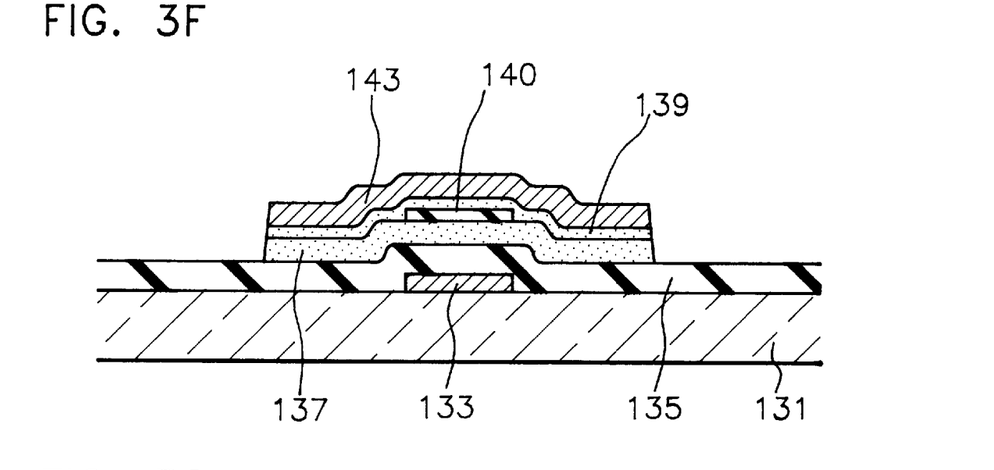

Next, as shown in FIG. 3E, a second metal layer 143, comprising one of Pd, Al—Si, Al—Si—Ti, and Al—Si—Cu, is sputter deposited, followed by depositing of a photosensitive layer. The photosensitive layer (not shown) is then exposed and developed to reveal selected portions of second metal layer 143. These portions are then removed, along with corresponding portions of the n$^+$ semiconductor layer 139 and semiconductor layer 137. Second metal layer 143, n$^+$ semiconductor layer 139, and semiconductor layer 137 are then patterned into a desired shape, as shown in FIG. 3F.

Figure 3G:
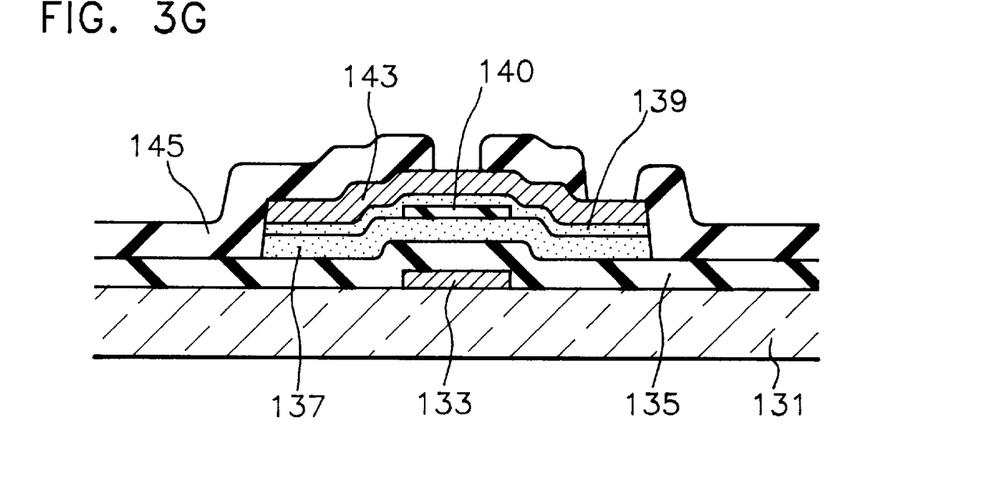

An insulating passivation layer 145 of Si-nitride is then deposited on the patterned second metal layer 143 and the gate insulating layer 135 by plasma CVD in an atmosphere of ammonia, silane, and hydrogen gases. Next, as shown in FIG. 3G, the insulating passivation layer is patterned to form an opening over etch-stopper 140 and a contact hole exposing a portion of second metal layer 143.

Figure 3H:
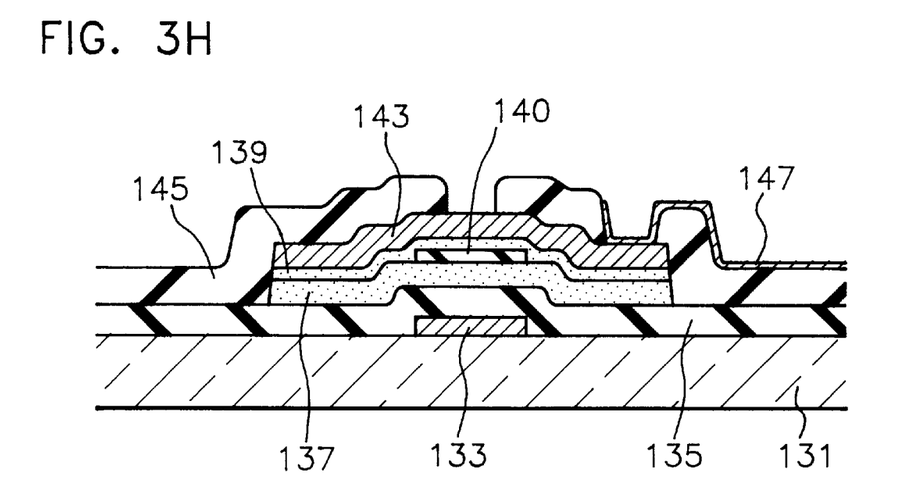
Figure 3I:
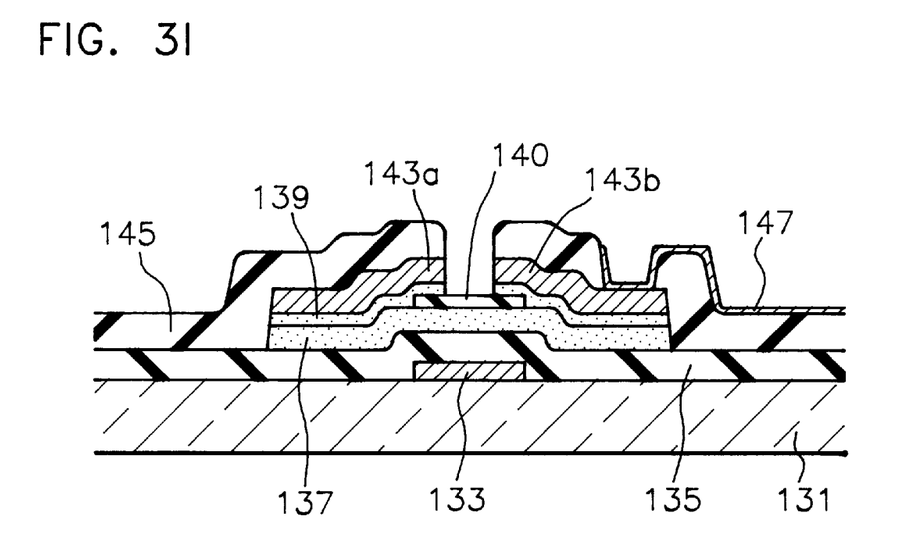

An ITO layer is deposited into the contact hole and on the insulating passivation layer 145 which is then patterned to form a pixel electrode 147 electrically connected with the second metal layer 143 through the contact hole as seen in FIG. 3H. As seen in FIG. 3I, source and drain electrodes, 143a and 143b, are next formed by etching the exposed portion of the second metal layer 143 and the n$^+$ semiconductor layer 139 using insulating passivation layer 145 as a mask. The reason of forming the pixel electrode 147 after etching the passivation layer 145 to form the opening and the contact hole and before etching the second metal layer 143 and n+ semiconductor layer 139 is that the pixel electrode 147 is protect the second metal layer 143 exposed through the contact hole to be etched. So, the sequence of manufacturing step is very important. Accordingly, second metal layer 143 and n$^+$ semiconductor layer 139 are etched in a single processing step. In contrast, in the conventional method described above, these layers overlying etch stopper 140 are etched respectively in separate steps.

The AMLCD manufactured by the above-described method has the structure described below. A gate bus line and a gate electrode 133 are formed on a transparent substrate 131. A gate insulating layer 135 covers the transparent glass substrate on which the gate bus line and the gate electrode 133 are formed. A semiconductor layer 137 is formed on the gate insulating layer 135, and an etch-stopper 140 is provided on the semiconductor layer 137 aligned with gate electrode 133. An impurity-doped n$^+$ semiconductor layer 139, includes two spaced portions, each of which overlaps etch-stopper 140 and semiconductor layer 137. The two spaced portion of n$^+$ semiconductor layer 139 has one part having a source electrode formed thereon and the other part having a drain electrode 143b formed thereon. An insulating passivation layer 145 covers the gate insulating layer, the source electrode 143a and the drain electrode 143b, and a pixel electrode on the insulating passivation layer is electrically connected with the drain electrode 143b through a contact hole formed in the insulating passivation layer.

Even though, the second insulating layer 140 may be not needed, in this case, the semiconductor layer 139 is exposed through the opening. So, the semiconductor layer 139 is not protected from the contacting materials thereon. Because the second insulating layer 140 made of silicon-oxide or silicon-nitride has a good adhesion with the semiconductor layer 139, it serves as etch stopper and passivation layer of semiconductor layer 139.

According to the present invention, the manufacturing cost is lowered and processing time is reduced because second metal layer 143 and impurity-doped semiconductor layer 139 and semiconductor layer 137 are patterned in the same step. Further, as recited above, source and drain regions are formed in a single processing step, without any additional mask steps. Yield is thus improved.

It well be apparent to those skilled in the art that various modifications and variations can be made in the AMLCD of the present invention and in construction of this AMLCD without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, including a thin film transistor, wherein the thin film transistor comprises:

a substrate;

a doped semiconductor layer having a first opening provided on said substrate;

a conductive layer provided on said doped semiconductor layer, having a second opening, a sidewall of said second opening being substantially aligned with the sidewall of the first opening; and a passivation layer provided on said conductive layer and having a third opening, a sidewall of said third opening being substantially aligned with the sidewall of the first and second opening.

2. A semiconductor device in accordance with claim 1, further comprising substantially undoped semiconductor layer provided between said doped semiconductor layer and said substrate, said substantially undoped semiconductor layer having an outer edge portion substantially aligned with other outer edge portions of said conductive layer and said doped semiconductor layer.

3. A semiconductor device in accordance with claim 1, further comprising:

a gate electrode formed on said substrate and an insulating layer formed on said gate electrode, said undoped semiconductor layer and said doped semiconductor layer being formed on said insulating layer.

4. A semiconductor device in accordance with claim 2, wherein said doped semiconductor layer includes first and second spaced portions, said semiconductor device further comprising:

an etch stop layer provided on said substantially undoped semiconductor layer between said first and second portions of said doped semiconductor layer.

5. A semiconductor device in accordance with claim 4, wherein said opening of said passivation layer is substantially aligned with said etch stop layer.

6. A semiconductor device in accordance with claim 1, wherein said conductive layer includes first and second spaced portions, said semiconductor device further comprising;

an electrode layer provided on a selected portion of said patterned passivation layer, said patterned passivation layer including a contact hole exposing a part of said first portion of conductive layer, said electrode layer electrically contacting said first portion of said conductive layer through said contact hole.

7. A semiconductor device in accordance with claim 6, wherein said electrode layer includes transparent conductive material.

* * * * *

UNITED STATES PATENT AND TRADEMARK OFFICE
CERTIFICATE OF CORRECTION

PATENT NO. : 6,025,605  
APPLICATION NO. : 08/799389  
DATED : February 15, 2000  
INVENTOR(S) : Lyu

Page 1 of 1

It is certified that error appears in the above-identified patent and that said Letters Patent is hereby corrected as shown below:

Claim 4, Col. 6, line 7, "claim 2" should read --claim 1--.

Signed and Sealed this

Twenty-ninth Day of August, 2006

JON W. DUDAS  
*Director of the United States Patent and Trademark Office*